(12) United States Patent
Suzuki et al.

(10) Patent No.: US 9,647,108 B2
(45) Date of Patent: May 9, 2017

(54) SILICON CARBIDE SEMICONDUCTOR DEVICE

(71) Applicants: DENSO CORPORATION, Kariya, Aichi-pref. (JP); TOYOTA JIDOSHA KABUSHIKI KAISHA, Toyota-shi, Aichi-ken (JP)

(72) Inventors: Naohiro Suzuki, Kariya (JP); Sachiko Aoi, Nagakute (JP); Yukihiko Watanabe, Nagakute (JP); Akitaka Soeno, Toyota (JP); Masaki Konishi, Toyota (JP)

(73) Assignees: DENSO CORPORATION, Kariya (JP); TOYOTA JIDOSHA KABUSHIKI KAISHA, Toyota-shi (JP)

(*) Notice: Subject to any disclaimer, the term of this patent is extended or adjusted under 35 U.S.C. 154(b) by 0 days.

(21) Appl. No.: 15/025,930

(22) PCT Filed: Sep. 15, 2014

(86) PCT No.: PCT/JP2014/004744
§ 371 (c)(1),
(2) Date: Mar. 30, 2016

(87) PCT Pub. No.: WO2015/049838
PCT Pub. Date: Apr. 9, 2015

(65) Prior Publication Data
US 2016/0247910 A1    Aug. 25, 2016

(30) Foreign Application Priority Data
Oct. 2, 2013  (JP) .................... 2013-207525

(51) Int. Cl.
*H01L 29/78* (2006.01)
*H01L 29/16* (2006.01)
(Continued)

(52) U.S. Cl.
CPC ........ *H01L 29/7813* (2013.01); *H01L 29/063* (2013.01); *H01L 29/0623* (2013.01);
(Continued)

(58) Field of Classification Search
CPC .................... H01L 29/1608; H01L 29/7813
See application file for complete search history.

(56) References Cited

U.S. PATENT DOCUMENTS

| 5,751,024 A | 5/1998 | Takahashi |
| 6,001,678 A | 12/1999 | Takahashi |

(Continued)

FOREIGN PATENT DOCUMENTS

| JP | 2001-267570 A | 9/2001 |
| JP | 2007-317779 A | 12/2007 |

(Continued)

OTHER PUBLICATIONS

International Search Report of the International Searching Authority dated Nov. 25, 2014 issued in the corresponding International application No. PCT/JP2014/004744 (and English translation).

*Primary Examiner* — Daniel Luke
(74) *Attorney, Agent, or Firm* — Posz Law Group, PLC

(57) ABSTRACT

A silicon carbide semiconductor device includes: a substrate; a drift layer; a current dispersion layer; a base region; a source region; trenches; a gate insulation film; a gate electrode; a source electrode; a drain electrode; and a bottom layer. The current dispersion layer is arranged on the drift layer, and has a first conductive type with an impurity concentration higher than the drift layer. The bottom layer has a second conductive type, is arranged under the base region, covers a bottom of each trench including a corner portion of the bottom of the trench, and has a depth equal to or deeper than the current dispersion layer.

8 Claims, 8 Drawing Sheets

(51) Int. Cl.
*H01L 29/66* (2006.01)
*H01L 29/06* (2006.01)
*H01L 29/08* (2006.01)
*H01L 29/10* (2006.01)
*H01L 29/167* (2006.01)

(52) U.S. Cl.
CPC ........ *H01L 29/086* (2013.01); *H01L 29/0878* (2013.01); *H01L 29/1095* (2013.01); *H01L 29/167* (2013.01); *H01L 29/1608* (2013.01); *H01L 29/66068* (2013.01)

(56) References Cited

U.S. PATENT DOCUMENTS

| | | | |
|---|---|---|---|
| 6,040,599 | A | 3/2000 | Takahashi |
| 6,221,721 | B1 | 4/2001 | Takahashi |
| 6,342,709 | B1 | 1/2002 | Sugawara et al. |
| 6,768,168 | B1 | 7/2004 | Takahashi |
| 2004/0065920 | A1 | 4/2004 | Henson |
| 2009/0261350 | A1 | 10/2009 | Yamamoto et al. |
| 2011/0068353 | A1 | 3/2011 | Nakano |
| 2011/0291110 | A1* | 12/2011 | Suzuki ................ H01L 29/1095 257/77 |
| 2014/0034969 | A1 | 2/2014 | Nakano |

FOREIGN PATENT DOCUMENTS

| | | |
|---|---|---|
| JP | 2010-129820 A | 6/2010 |
| JP | 2010-177474 A | 8/2010 |
| JP | 2010-181656 A | 8/2010 |
| JP | 2010-182912 A | 8/2010 |
| JP | 2010-219361 A | 9/2010 |
| JP | 2010-232627 A | 10/2010 |
| JP | 2010-258385 A | 11/2010 |

* cited by examiner

SILICON CARBIDE SEMICONDUCTOR DEVICE

CROSS REFERENCE TO RELATED APPLICATION

This application is a U.S. national stage of International Application No. PCT/JP2014/004744 filed on Sep. 15, 2014 and is based on Japanese Patent Application No. 2013-207525 filed on Oct. 2, 2013, the disclosures of which are incorporated herein by reference.

TECHNICAL FIELD

The present disclosure relates to a silicon carbide (i.e., SiC) semiconductor device having a trench gate.

BACKGROUND ART

Recently, SiC as a material for a power device, which provides high electric field breakdown strength, is brought to attention. Since a SiC semiconductor device has high electric field breakdown strength, the device can control large current. Thus, the device is expected to apply a control of a motor for a hybrid vehicle.

In the SiC semiconductor device, it is effective to increase a channel density for flowing large current. Accordingly, in a silicon transistor, a trench gate structure MOSFET is utilized and put to practical use. The trench gate structure is also applied to the SiC semiconductor device. However, when the structure is applied to the SiC, it has a large difficulty. Specifically, the SiC has the breakdown electric field strength higher ten times than silicon. Thus, the SiC semiconductor device is utilized under a condition that a voltage higher ten times than a silicon device is applied to the SiC semiconductor device. Thus, the electric field having strength higher ten times than the silicon device is applied to a gate insulation film, which is formed in a trench formed in the SiC. Thus, it has a difficulty such that the gate insulation film at a corner of the trench is easily damaged. When calculating with simulation under a condition that 1200 volts is applied to the drain, the electric field of 10 MV/cm is concentrated at the trench gate. It is necessary to reduce the electric field to be equal to or lower than 5 MV/cm, which is a half of 10 MV/cm in order to utilize actually.

To solve the above difficulty, Patent Literature No. 1 proposes a SiC semiconductor device, in which a P type layer is formed on a bottom of a trench, which provides the trench gate structure. Thus, when the P type layer is formed on the bottom of the trench, which provides the trench gate structure, the electric field concentration in the gate insulation film on the bottom of the trench is reduced, so that the gate insulation film is prevented from being damaged. Further, if the P type layer is formed on only the bottom of the trench, a surge may penetrate into the bottom of the trench gate structure and damage the gate insulation film when the surge occurs. Accordingly, the P type layer is formed also between adjacent trenches, so that an equipotential line is prevented from being penetrated between the trenches when applying a reverse bias, and the gate insulation film is prevented from being damaged.

However, since the SiC is a material having a wide gap, an inner electric potential of the SiC is equal to or larger than 3 volts, which is large. Accordingly, even when a source and/or a drain is connected to a zero volt ground, a depletion layer, which is prepared by applying minus three volts to the P type layer, expands naturally. Accordingly, the depletion layer expanding from the P type layer narrows a current passage between P type layers, and therefore, a difficulty arises that the on-state resistance increases.

PRIOR ART LITERATURES

Patent Literature

Patent Literature No. 1: JP-2001-267570 A

SUMMARY OF INVENTION

It is an object of the present disclosure to provide a silicon carbide semiconductor device, in which a gate insulation film is prevented from being damaged, and an increase of an on-state resistance is reduced.

According to an aspect of the present disclosure, a silicon carbide semiconductor device includes an inversion type MOSFET, which has: a substrate; a substrate; a drift layer; a current dispersion layer; a base region; a source region; a plurality of trenches; a gate insulation film; a gate electrode; a source electrode; a drain electrode; and a bottom layer.

The substrate is made of silicon carbide and has a first conductive type or a second conductive type. The drift layer is made of silicon carbide, is arranged on the substrate, and has the first conductive type with an impurity concentration lower than the substrate. The current dispersion layer is made of silicon carbide, is arranged on the drift layer, and has the first conductive type with an impurity concentration higher than the drift layer. The base region is made of silicon carbide, is arranged on the current dispersion layer, and has the second conductive type. The source region is made of silicon carbide, is arranged in an upper portion of the base region, and has the first conductive type with an impurity concentration higher than the drift layer.

The plurality of trenches are arranged from a surface of the source region to a position deeper than the base region, is arranged in parallel to each other, and has a stripe shape along one direction as a longitudinal direction. The gate insulation film is arranged on an inner wall of each trench. The gate electrode is arranged on the gate insulation film in each trench. The source electrode is electrically connected to the source region and the base region. The drain electrode is arranged on a back side of the substrate. The bottom layer is arranged under the base region, covers a bottom of each trench including a corner portion of the bottom of the trench, has a depth equal to or deeper than the current dispersion layer, and has the second conductive type. The inversion type MOSFET provides an inversion type channel region in a surface portion of the base region, which is disposed on a sidewall of the trench, by controlling an application voltage to the gate electrode. The MOSFET flows current between the source electrode and the drain electrode through the source region, the current dispersion layer and the drift layer.

In the silicon carbide semiconductor device, the bottom layer is arranged to cover the bottom of each trench, and the current dispersion layer is arranged between the base region and the drift layer. Accordingly, it is possible to relax an electric field concentration in the gate insulation film on the bottom of the trench. Thus, the gate insulation film is prevented from being damaged. Further, a current passage is secured that the current passage between a current accumulation layer and the drift layer is not depleted by a depletion layer, the current accumulation layer includes a portion between the base region and the bottom layer, at which the trench contacts the current dispersion layer. Thus, an on-state resistance is reduced.

BRIEF DESCRIPTION OF DRAWINGS

The above and other objects, features and advantages of the present disclosure will become more apparent from the following detailed description made with reference to the accompanying drawings. In the drawings.

EMBODIMENTS FOR CARRYING OUT INVENTION

Figure 1:
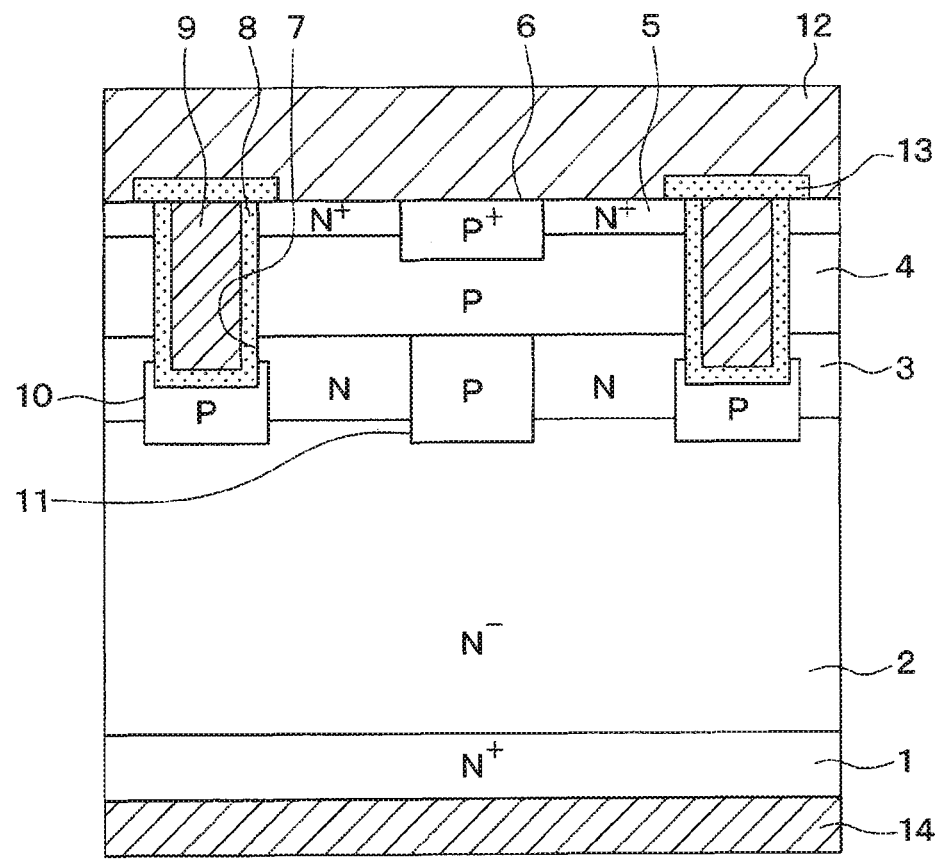
FIG. 1 is a cross sectional diagram showing a MOSFET having a trench gate structure according to a first embodiment of the present disclosure.

Embodiment of the present disclosure will be explained with reference to drawings as follows. Here, the same reference numeral is put in the same or equivalent elements in each of embodiments.

First Embodiment

A first embodiment of the present disclosure will be explained as follows. Here, a reverse type MOSFET having a trench gate structure, which is equipped as an element of a SiC semiconductor device, will be explained.

First, a cross sectional view of the MOSFET having the trench gate structure according to the present embodiment will be explained with reference to FIG. 1. FIG. 1 corresponds to a part, which is prepared by retrieving two cells of the MOSFET. Although FIG. 1 merely shows two cells of the MOSFET, the MOSFET having the same structure of the MOSFET shown in FIG. 1 is arranged adjacent to each other in multiple lines.

The MOSFET shown in FIG. 1 is prepared by using a N+ type layer 1 made of a SiC substrate and the like. The N+ type layer 1 has a N type impurity concentration such as phosphorous in a range between $5.0 \times 10^{18}/cm^3$ and $1.0 \times 10^{20}/cm^3$ and a thickness in a range between 100 micrometers and 400 micrometers. Here, the N type impurity concentration is $1.0 \times 10^{19}/cm^3$, and the thickness is 100 micrometers. A N− type drift layer 2 made of SiC is formed on the surface of the N+ type layer 1. The drift layer 2 has a N type impurity concentration such as phosphorous in a range between $7.0 \times 10^{15}/cm^3$ and $1.0 \times 10^{16}/cm^3$ and a thickness in a range between 8 micrometers and 12 micrometers. Here, the N type impurity concentration is $8.0 \times 10^{15}/cm^3$, and the thickness is 10 micrometers. The impurity concentration of the N− type drift layer 2 may be constant in a depth direction. Alternatively, the concentration distribution of the impurity concentration may have a gradient, and a N+ type layer side of the N− type drift layer 2 may have high impurity concentration than a side far from the N+ type layer 1. In this case, the inner resistance of the N− type drift layer 2 is reduced, so that the on-state resistance is also reduced.

A N type current dispersion layer 3 and a P type base region 4 are formed in a surface portion of the N− type drift layer 2. Further, a N+ type source region 5 and a P+ type contact layer 6 are formed in an upper portion of the P type base region 4.

The N type current dispersion layer 3 is configured to have a N type impurity concentration such as phosphorous in a range between $5.0 \times 10^{16}/cm^3$ and $2.5 \times 10^{17}/cm^3$ and a thickness in a range between 0.7 micrometers and 1.2 micrometers, for example. Here, the N type impurity concentration is $1.0 \times 10^{17}/cm^3$ and the thickness is 1.0 micrometers. The impurity concentration of the N type current dispersion layer 3 is set to be a concentration, which provides to make the distance between the P type base region 3 and the P type bottom layer 10 larger twice than the distance of the depletion layer extending to the N type current dispersion layer 3 in an inner electric potential (i.e., about three volts) of the SiC. Specifically, the distance L of the depletion layer extending to the N type current dispersion layer in view of the inner electric potential of the SiC is calculated by the equation No. 1. In the equation No. 1, Nd represents an impurity concentration of the N type current dispersion layer 3. $\in_0$ represents a dielectric constant of vacuum (i.e., $8.854 \times 10^{-14}$ F/cm). q represents an elementary charge (i.e., $1.6 \times 10^{-19}$ C). Ks represents a relative dielectric constant (i.e., about 10) of silicon carbide. ψd represents an inner electric potential (i.e., about 3 volts) of silicon carbide. Accordingly, the impurity concentration of the N type current dispersion layer 3 is set to make the distance between the P type base region 3 and the P type bottom layer 10 larger twice than L calculated by the equation No. 1. For example, when Nd is equal to $1 \times 10^{17}/cm^3$, the right side of the equation No. 1 is 0.364 micrometers. Here, since, in the equation No. 1, it is assumed that the depletion layer extends only in the N type current dispersion layer side, the actual extending distance of the depletion layer is shorter than the equation No. 1.

$$L = \sqrt{\frac{2Ks\varepsilon_0\psi d}{qNd}} \quad \text{(Equation No. 1)}$$

The P type base region 4 is configured to have the P type impurity concentration such as boron and aluminum in a range between $1.0 \times 10^{17}/cm^3$ and $3.0 \times 10^{17}/cm^3$, and a thickness in a range between 1.0 micrometers and 1.4 micrometers. Here, the P type impurity concentration is $2.0 \times 10^{17}/cm^3$, and the thickness is 1.2 micrometers.

The N type source region 5 is configured to have the N type impurity concentration such as phosphorus of the surface portion in a range between $1.0 \times 10^{20}/cm^3$ and $3.0 \times 10^{20}/cm^3$ (here, the N type impurity concentration is $1.0 \times 10^{20}/cm^3$) and a thickness about 0.5 micrometers. The P+ type contact layer 6 contacts the later described source electrode 12 and the P type base region 4 with a low resistance. The P+ type contact layer 6 is configured to have the P type impurity concentration (i.e., a surface concentration) such as boron and aluminum of the surface portion in a range between $1.0 \times 10^{20}/cm^3$ and $1.0 \times 10^{21}/cm^3$ (here, the P type impurity concentration is $1.0 \times 10^{20}/cm^3$), and a thickness about 0.7 micrometers. The N+ type source region 5 is arranged on both sides of the later described trench gate structure. The P+ type contact layer 6 is arranged on a side opposite to the trench gate structure through the N+ type source region 5.

Further, the trench 7 is formed to have a width in a range between 0.8 micrometers and 1.2 micrometers and a depth from the surface of the N+ type source region 5 in a range between 1.7 micrometers and 2.1 micrometers so as to penetrate the P type base region 4 and the N+ type source region 5 and to reach a middle point of the N type current dispersion layer 3 in the thickness direction. Here, the width of the trench 7 is 0.8 micrometers, and the depth of the trench 7 is 1.9 micrometers. For example, the distance (i.e., a pitch) between adjacent trenches 7 is 4.0 micrometers, for example. The P type base region 4 and the N+ type source region 5 are arranged to contact a sidewall of the trench 7.

Further, an inner wall of the trench 7 is covered with a gate oxide film 8. The thickness of the gate oxide film 8 is in a range between 60 nanometers and 80 nanometers, for example. Here, the thickness is 75 nanometers. Further, the trench 7 is fully filled with the gate electrode 9, which is formed on the surface of the gate oxide film 8. The gate electrode 9 is made of poly silicon with doping an impurity.

Thus, the trench gate structure is prepared. The trench gate structure extends along a vertical direction of the drawing in FIG. 1 as a longitudinal direction. Further, multiple trench gate structures are arranged in parallel to each other in a right-left direction of FIG. 1, so that the trench gate structures provides to have a stripe shape. Further, the above described N+ type source region 5 and the P+ type contact layer 6 have a structure such that they extend along the longitudinal direction of the trench gate structures.

A P type bottom layer 10 is formed to cover the bottom of the trench 7 and to reach the N− type drift layer 2 from a position, which is separated apart from a lower surface of the P type base region 4 by a predetermined distance. Here, to cover the bottom of the trench 7 means to cover the bottom of the trench 7 including a corner portion. Thus, it means that the P type bottom layer 10 is formed to reach the sidewall from the bottom of the trench 7. For example, the P type bottom layer 10 is formed to be space apart from the bottom of the P type base region 4 by a distance in a range between 0.3 micrometers and 0.5 micrometers. Here, the distance is 0.4 micrometers. Further, the P type bottom layer 10 has a depth in a range between 0.8 micrometers and 1.0 micrometers, and a width with which the layer 10 protrudes from the trench 7 on both sides by a predetermined distance. Here, the depth is 0.9 micrometers, and the width is set to protrude from the trench 7 on both sides by 0.2 micrometers respectively. The P type impurity concentration such as boron and aluminum in the P type bottom layer 10 is, for example, in a range between $2.0 \times 10^{17}/cm^3$ and $5.0 \times 10^{17}/cm^3$ (here, the concentration is $5.0 \times 10^{17}/cm^3$). This concentration is equal to or larger twice than the N type current dispersion layer 3, for example. The concentration is higher than a concentration under a fully depleted condition so as not to fully deplete with the depletion layer, which expands from a boundary portion of the N type current dispersion layer 3 in case of a reverse bias (i.e., when a voltage is applied to the later described drain electrode 14).

Further, the P type deep layer 11 made of a P type film is formed between the adjacent trenches 7 among multiple trenches 7 arranged in parallel to each other so as to contact the bottom of the P type base region 4 and to reach the N− type drift layer 2. For example, the P type deep layer 11 has a lower surface, which has the same depth as the P type bottom layer 10. Here, the depth from the lower surface of the P type base region 4 is 1.3 micrometers. The P type impurity concentration such as boron and aluminum in the P type deep layer 11 is equal to the concentration of the P type bottom layer 10. Accordingly, the concentration of the P type deep layer 11 is higher than a concentration under a fully depleted condition so as not to fully deplete with the depletion layer, which expands from a boundary portion of the N type current dispersion layer 3 in case of a reverse bias (i.e., when a voltage is applied to the later described drain electrode 14).

Further, the source electrode 12 and a gate wiring (not shown) are formed on the surface of the N+ type source region 5 and the P+ type contact layer 6 and the surface of the gate electrode 9. The source electrode 12 and the gate wiring are made of multiple metals (e.g., Ni and Al). At least a portion of the source electrode 12 and the gate wiring that contacts N type SiC (specifically, which is the N+ type source region 5 and the gate electrode 9 in case of doping with N type) is made of metal for contacting the N type SiC with an Ohmic contact. Further, at least a portion of the source electrode 12 and the gate wiring that contacts N type SiC (specifically, which is the N+ type source region 5 and the gate electrode 9 in case of doping with N type) is made of metal for contacting the N type SiC with an Ohmic contact. Further, at least a portion of the source electrode 12 and the gate wiring that contacts P type SiC (specifically, which is the P+ type contact layer 6 and the gate electrode 9 in case of doping with P type) is made of metal for contacting the P type SiC with an Ohmic contact. Here, the source electrode 12 and the gate wiring are formed on an interlayer insulation film 13 so that they are electrically isolated from each other. The source electrode 12 is electrically connected to the N+ type source region 5 and the P+ type contact layer 6 through a contact hole formed in the interlayer insulation film 13, and the gate wiring is electrically connected to the gate electrode 9 through the contact hole in the film 13.

The drain electrode 14 is formed on the back side of the N+ type layer 1 so that the drain electrode 14 is electrically connected to the N+ type layer 1. These features provide a N channel reverse type MOSFET having the trench gate structure.

The reverse type MOSFET having the trench gate structure functions as follows.

First, before a gate voltage is applied to the gate electrode 9, no inversion layer is formed in the P type base region 4. Accordingly, even when a positive voltage is applied to the drain electrode 14, the inversion layer does not reach in the P type base region 4, and therefore, no current flows between the source electrode 12 and the drain electrode 14.

Next, in case of an off state (i.e., when the gate voltage is zero volt, the drain voltage is 1200 volts, and the source voltage is zero volt), even when a voltage is applied to the drain electrode 14, a reverse bias is generated. Accordingly, the depletion layer expands from a boundary between the P type base region 4 and the N type current dispersion layer 3 or the N− type drift layer 2 (including the current dispersion layer 2a). In this case, since the concentration of the P type base region 4 is $2.0 \times 10^{17}/cm^3$ and high, the depletion layer almost expands in the N− type drift layer side even though the concentration of the N type current dispersion layer 3 is $1.0 \times 10^{17}/cm^3$. The expansion of the depletion layer is about 10 micrometers. Accordingly, the P type base region 4 does not provide a punch-through phenomenon, and no current flows between the source electrode 12 and the drain electrode 14.

Further, since the gate voltage is zero volt, the electric field is applied between a drain and a gate. In this case, since the P type bottom layer 10 having the N type impurity concentration of $5.0 \times 10^{17}/cm^3$ covers the bottom of the trench 7, the depletion layer penetrating into the P type bottom layer 10 is equal to or shorter than 0.2 micrometers. Thus, the expansion of the depletion layer is reversely proportion to the impurity concentration, and the expansion of the depletion layer in the N− type drift layer 2 is about 10 micrometers. Since the impurity concentration of the P type bottom layer 10 is equal to or higher 50 or more times than the N− type drift layer 2, the depletion layer expands in the P type bottom layer 10 within only the above size. Accordingly, since the depletion layer does not reach the trench 7, the electric field does not concentrate at the bottom of the trench 7, which is surrounded with the P type bottom layer 10. Thus, the electric field concentration in the gate oxide film 8, specifically, the electric field concentration in the gate oxide film 8 at the bottom of the trench 7 is reduced. Thus, it is possible to prevent the gate oxide film 8 from being damaged.

A portion of the trench that protrudes from the lower surface of the P type base region 4 and reaches the P type bottom layer 10 is a region of the trench 7, around which no P type layer is disposed. However, in the present embodiment, since the protrusion amount of the trench 7 is small, the electric field concentration is small. Thus, when the drain voltage is 1200 volts, the electric field applied to the protrusion portion is about 4.4 MV/cm. This is a voltage having a level that no insulation breakdown occurs even when the voltage is applied to the gate insulation film 8. Accordingly, in the present embodiment, even when the voltage of 1200 volts is applied to the drain electrode 14, the gate oxide film 8 does not break down, and therefore, it is possible to provide the breakdown voltage of 1200 volts.

Next, in case of the on-state (i.e., when the gate voltage is 20 volts, the drain voltage is 2 volts, and the source voltage is zero volt), the following operation is executed. Specifically, when the impurity concentration of the SiC is $1.0 \times 10^{17}/cm^3$ and high, for example, even when the source voltage is zero volt, the P type base region 4 functions to provide minus three volts. Thus, the depletion layer expands from the P type base region 4 to the N type current dispersion layer side. The expansion amount is determined by the impurity concentration of the N type current dispersion layer 3. When the amount is studied by a simulation, the expansion amount is 0.3 micrometers in a case where the impurity concentration of the N type current dispersion layer 3 is $8.0 \times 10^{15}/cm^3$, and the expansion amount is 0.08 micrometers in a case where the impurity concentration of the N type current dispersion layer 3 is $1.0 \times 10^{17}/cm^3$.

Figure 2:
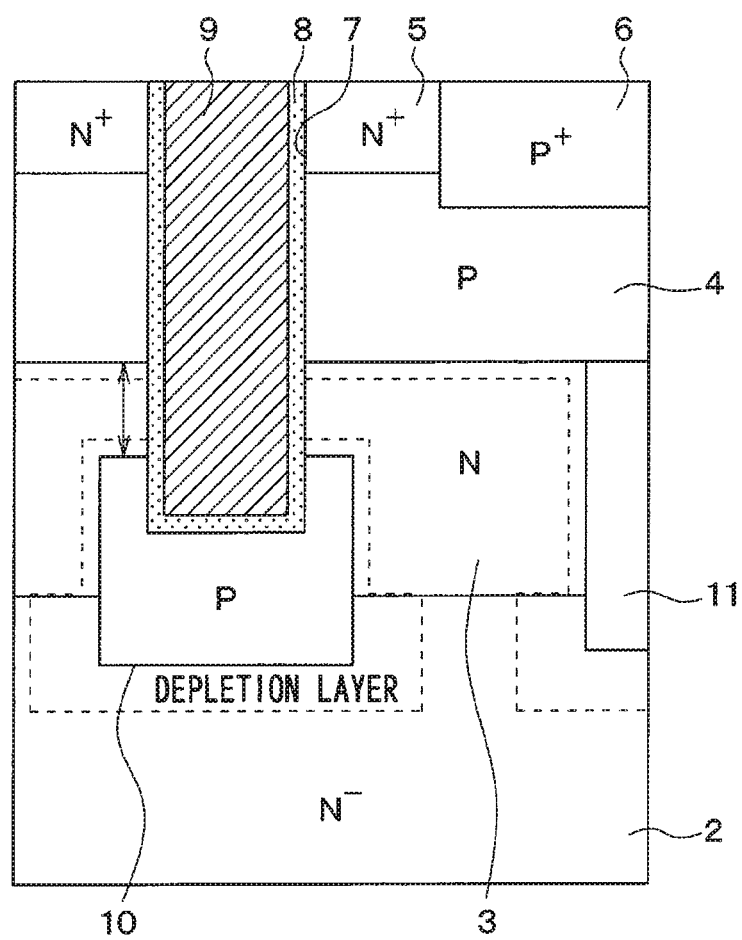
FIG. 2 is a cross sectional diagram showing a way for expanding a depletion layer when the MOSFET shown in FIG. 1 is in an on-state.

FIG. 2 shows an expansion manner of the depletion layer in case of the on state under a condition that the impurity concentration of each part in the MOSFET is set to be an above described concentration according to the present embodiment. The depletion layer has very high resistance, so that it is difficult to flow current therethrough. In the present embodiment, since the N type current dispersion layer 3 has the impurity concentration higher than the N− type drift layer 2, the expansion of the depletion layer is restricted. Accordingly, a current passage between a current accumulation layer and the N− type drift layer 2 not depleted by the depletion layer is secured, the current accumulation layer being a portion, between the P type base region 4 and the P type bottom layer 10, on which the trench 7 contacts the N type current dispersion layer 3, so that the on-state resistance is reduced.

Figure 3:
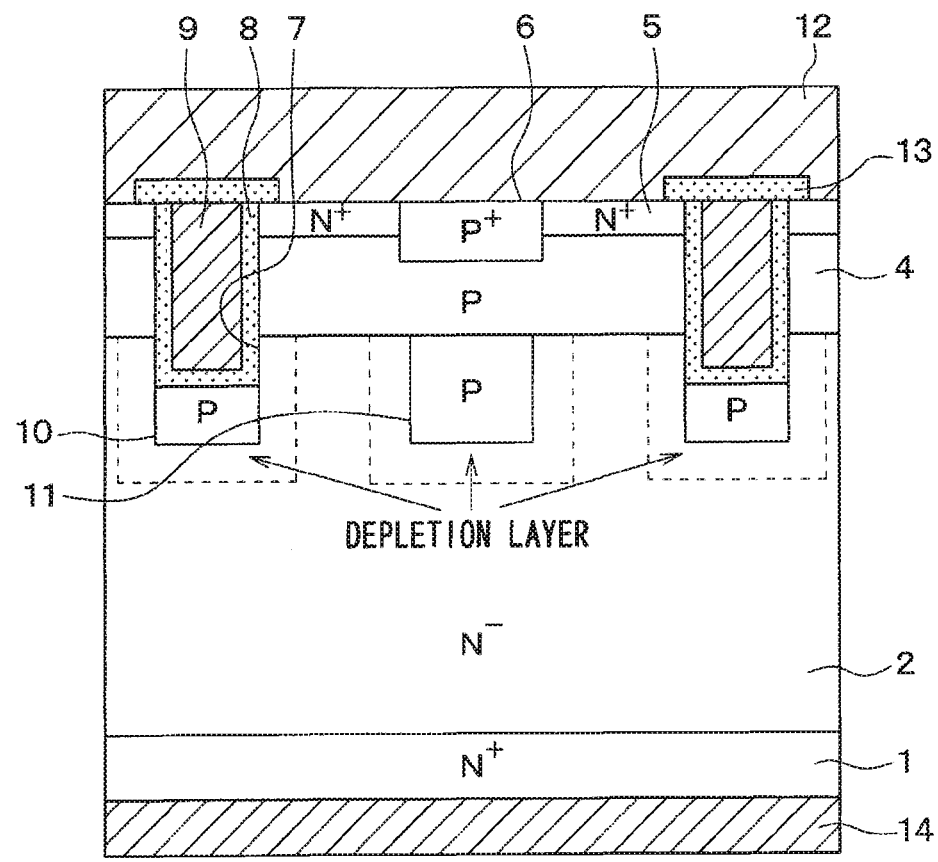
FIG. 3 is a cross sectional diagram showing a way for expanding the depletion layer in a structure of the MOSFET shown in FIG. 1 without forming a N type current dispersion in the MOSFET shown in FIG. 1.

On the other hand, FIG. 3 shows an expansion manner of the depletion layer in case of the on-state in the structure that the N type current dispersion layer 3 is removed from the MOSFET according to the present embodiment. As shown in the drawing of FIG. 3, when the N type current dispersion layer 3 is not formed, a not-formed portion provides the N− type drift layer 2, and therefore, the depletion layer expands largely in the N− type drift layer 2. Accordingly, the portion, between the P type base region 4 and the P type bottom layer 10, on which the trench 7 contacts the N− drift layer 2, is also surrounded with the depletion layer, so that the current passage is not secured, and the on-state resistance increases.

Accordingly, when the structure has the N type current dispersion layer 3 according to the present embodiment, it is possible to reduce the on-state resistance much more.

Since the gate voltage of 20 volts is applied to the gate electrode 9, the inversion layer is formed on the surface of the P type base region 4, which contacts the trench 7, and further, the current accumulation layer is formed on the surface of the N type current dispersion layer 3, which contacts the trench 7. Accordingly, the electron injected from the source electrode 12 passes from the N+ type source region 5 through the inversion layer and the current accumulation layer formed in the P type base region 4, and then, reaches the N type current dispersion layer 3. Thus, the current flows between the source electrode 12 and the drain electrode 14 under a condition that a current flowing range in the N type current dispersion layer 3 having a comparative high impurity concentration is expanded. In this case, the resistance from the N+ type source region 5 to the current accumulation layer is 0.6 mΩ·cm².

Here, the electron reaches the N− type drift layer 2 through a passage having a low resistance in the N type current dispersion layer 3 other than the depletion layer. Here, the resistance is 0.4 Ω·cm². In the structure shown in FIG. 3 having no N type current dispersion layer 3, a most part of the current passage is depleted by the depletion layer, and therefore, the resistance becomes high and is 0.8 Ω·cm².

The electron reached the N− type drift layer 2 passes through the N+ type layer 1 and reaches the drain electrode 14. In this case, the drift resistance is 0.8 Ω·cm², and the resistance of the N+ type layer 1 is 0.25 Ω·cm². These resistances are the same in eth structures shown in FIGS. 2 and 3.

Accordingly, in case of the structure shown in FIG. 2 according to the present embodiment, when the gate voltage is 20 volts, and the thickness of the gate oxide film 8 is 75 nanometers, the on-state resistance is 2.05 Ω·cm² (which is a sum of 0.6+0.4+0.8+0.25) and low resistance. On the other hand, in the structure shown in FIG. 3, the on-state resistance is 2.45 Ω·cm² (which is a sum of 0.6+0.8+0.8+0.25), and higher by 0.4 Ω·cm² than the structure shown in FIG. 2 according to the present embodiment. Thus, the MOSFET according to the present embodiment realizes the low on-state resistance in addition to the high breakdown voltage.

Next, a manufacturing method of the trench gate type MOSFET shown in FIG. 1 will be explained with reference to FIGS. 4A to 6B.

Figure 4A:
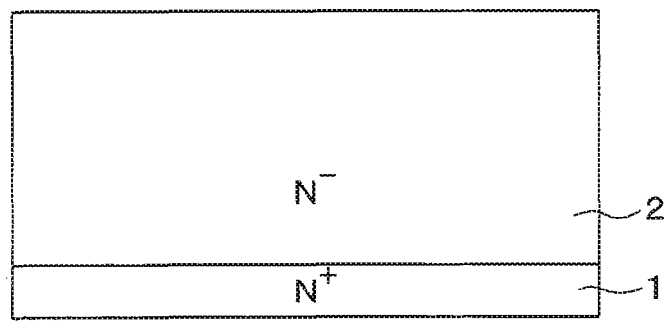
FIGS. 4A to 4C are cross sectional diagrams showing a manufacturing process of the MOSFET shown in FIG. 1.

(Step Shown in FIG. 4A)

First, a structure in which the N− type drift layer 2 is formed on the N+ type layer 1 is prepared. For example, a N+ type SiC substrate is prepared as the N+ type layer 1, and the N− type drift layer 2 is grown epitaxially.

Figure 4B:
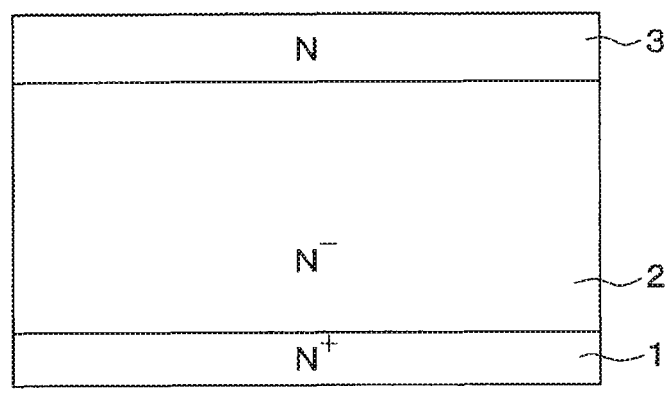

(Step Shown in FIG. 4B)

A part of the N type current dispersion layer 3 is formed on the surface of the N− type drift layer 2. For example, the N type impurity (such as nitrogen) is ion-implanted in the surface portion of the N− type drift layer 2, or the epitaxial growth condition of the N− type drift layer 2 is changed in the middle so that the N type impurity concentration is increased. Thus, the N type current dispersion layer 3 is formed.

Figure 4C:
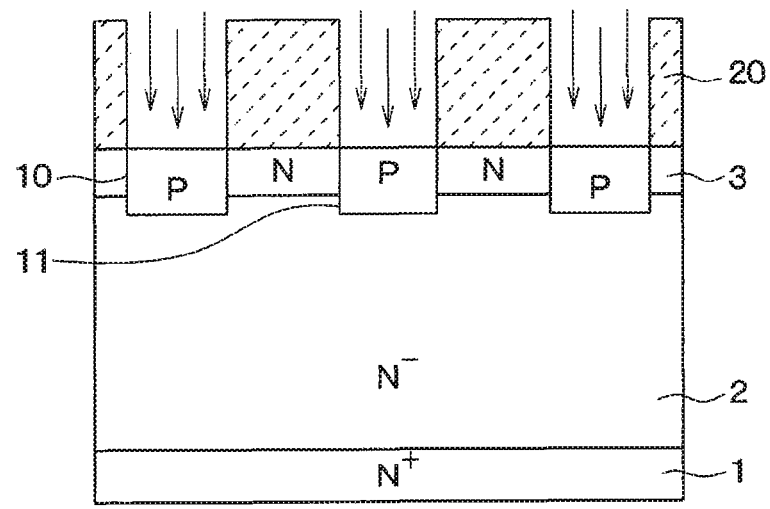

(Step Shown in FIG. 4C)

After the mask 20 made of LTO is formed on the surface of the N type current dispersion layer 3, an opening is formed by a photo-lithography method in the mask at a region, where the P type bottom layer 10 and the P type deep layer 11 are to be formed. Thus, the opening having a layout of the same stripe shapes of the P type bottom layer 10 and the P type deep layer 11 is formed in the mask 20. Then, after the P type impurity (such as boron and aluminum) is ion-implanted over the mask 20, an activation process is executed, so that the P type bottom layer 10 is formed and the part of the P type deep layer 11 is formed. Then, the mask 20 is removed.

Figure 5A:
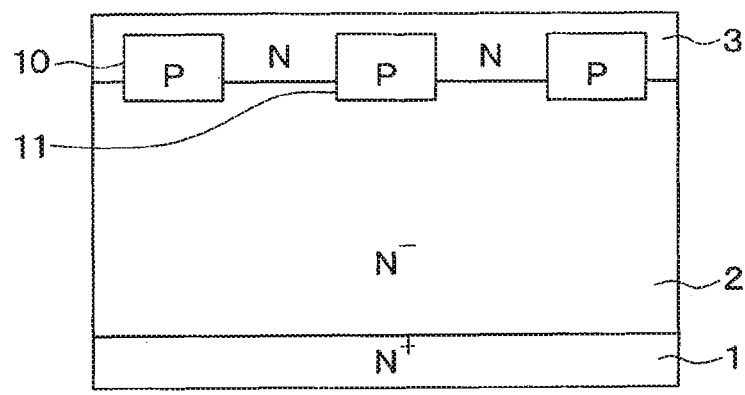
FIGS. 5A to 5C are cross sectional diagrams showing the manufacturing process of the MOSFET next to FIG. 4C.

(Step Shown in FIG. 5A)

Again, a remaining part of the N type current dispersion layer 3 is formed by epitaxially growing on the surface of the N type current dispersion layer 3, on which the P type bottom layer 10 and the part of the P type deep layer 11 are formed.

Figure 5B:
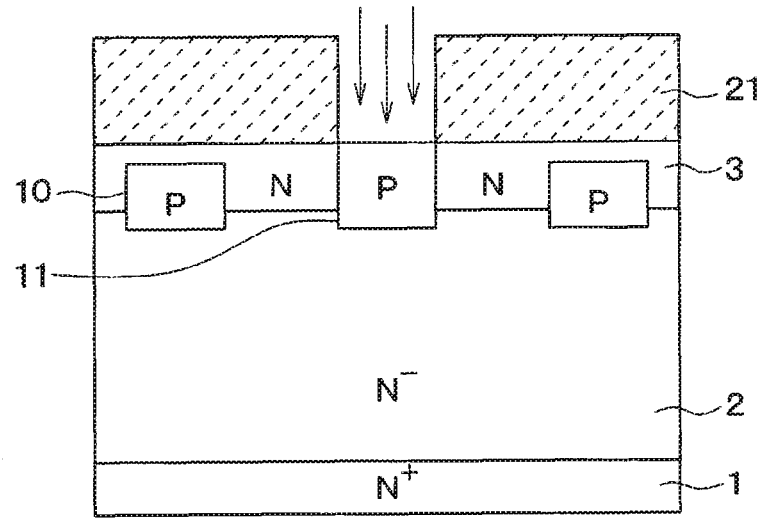

(Step Shown in FIG. 5B)

The mask 21 made of LTO is formed on the surface of the N type current dispersion layer 3. Then, an opening is formed in the mask 21 by the photo-lithography method at a region, in which the P type deep layer 11 is to be formed. Thus, the opening having a layout of the same stripe shape of the P type deep layer 11 is formed in the mask 21. Then, after the P type impurity (such as boron and aluminum) is ion-implanted over the mask 21, an activation process is executed, so that the remaining part of the P type deep layer 11 is formed. Then, the mask 21 is removed.

Figure 5C:
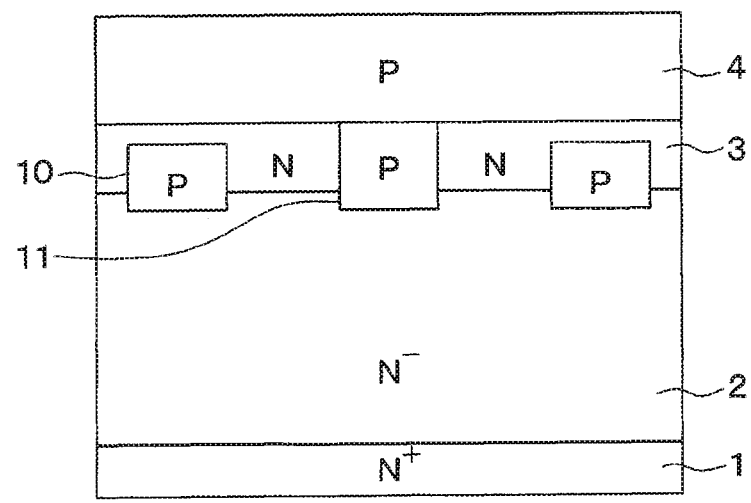

(Step Shown in FIG. 5C)

The P type base region 4 is epitaxially grown on the surface of the N type current dispersion layer 3 and the P type deep layer 11.

Figure 6A:
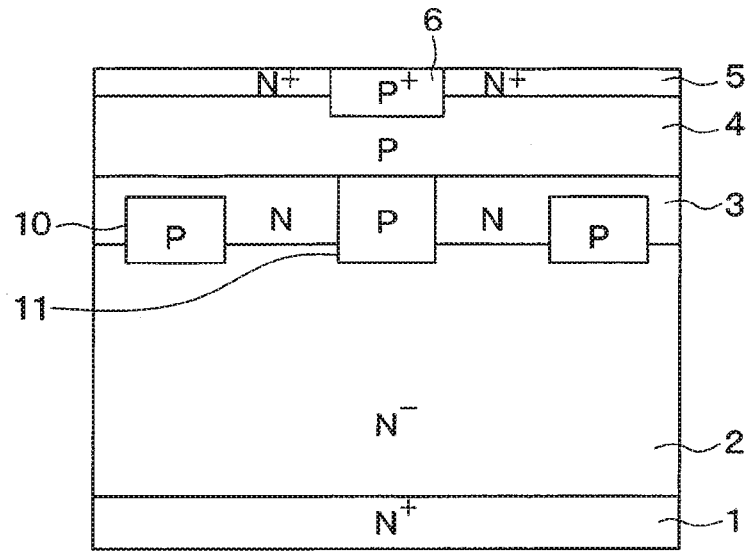
FIGS. 6A to 6B are cross sectional diagrams showing the manufacturing process of the MOSFET next to FIG. 5C.

(Step Shown in FIG. 6A)

A mask not shown is formed to have an opening disposed at a region, in which the N+ type source region 5 is to be formed. Then, the N type impurity (such as nitrogen) is ion-implanted over the mask, and then, the mask is removed. Further, after the mask is formed to have an opening disposed at a region in which the P+ type contact layer 6 is to be formed, the P type impurity (such as boron and aluminum) is ion-implanted over the mask. Then, the mask is removed. After that, the activation process is executed, so that the N+ type source region 5 and the P+ type contact layer 6 are formed.

Figure 6B:
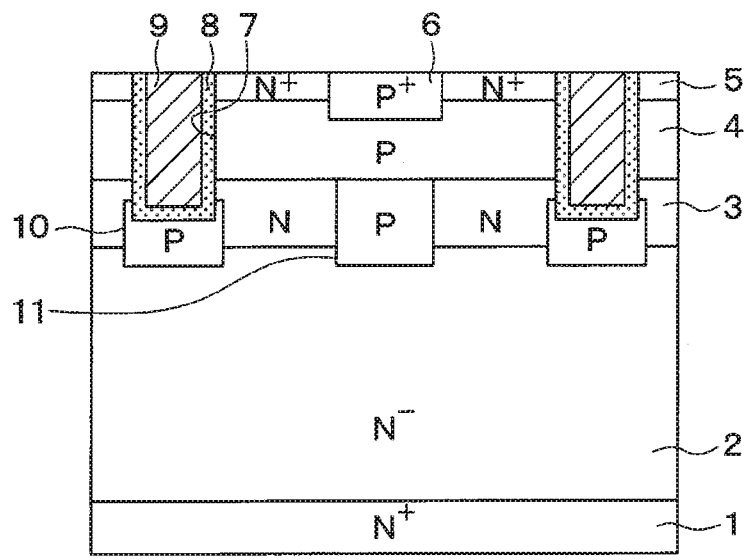

(Step Shown in FIG. 6B)

An etching mask not shown is deposited on the P type base region 4, the N+ type source region 5 and the P+ type contact layer 6. Then, an opening is formed in the etching mask at a region, in which the trench 7 is to be formed. Then, an anisotropic etching process is performed using the etching mask. Then, if necessary, an isotropic etching process and a sacrifice oxidation process are performed. Thus, the trench 7 is formed. After that, the etching mask is removed.

Next, a gate oxide film forming process is performed, so that the gate oxide film 8 is formed. Specifically, the gate oxide film 8 is formed by a pyro-genic method of gate oxidation process using a wet atmosphere (i.e., a thermal oxidation method). Then, a poly silicon layer doping the N type impurity is deposited on the surface of the gate oxide film 8, and then, the etch-back process and the like is executed, so that the gate oxide film 8 and the gate electrode 9 remains in the trench 7.

Steps after the above process are similar to a conventional method, and therefore, the steps are not shown. After the interlayer insulation film 12 is deposited, the interlayer insulation film 12 is patterned so that the contact hole is formed to connect to the N+ type source region 5 and the P+ type contact layer 6. Further, a contact hole for connecting to the gate electrode 9 is formed on another cross section. Then, an electrode material is deposited to fill in the contact hole, and the electrode material is patterned, so that the source electrode 12 and the gate wiring are formed. Further, the drain electrode 14 is formed on the backside of the N+ type layer 1. Thus, the MOSFET shown in FIG. 1 is completed.

As described above, in the present embodiment, the P type bottom layer 10 is formed to cover the bottom of the trench 7, and the N type current dispersion layer 3 is formed between the P type base region 4 and the N− type drift layer 2. Accordingly, it is possible to reduce the electric field concentration in the gate oxide film 8 on the bottom of the trench 7, and it is possible to prevent the gate oxide film 8 from being damaged. In addition, it is possible to reduce the on-state resistance.

Here, the P type bottom layer 10 covers the bottom of the trench 7 including the corner portion. An experiment for clarifying the effects of this feature is performed. Specifically, a comparison experiment is performed with changing the depth of the N type current dispersion layer 3 in a case where the P type bottom layer 10 covers the corner portion of the bottom of the trench 7 according to the present embodiment and a case where the P type bottom layer 10 is arranged under the bottom of the trench 7 without covering the corner portion. Specifically, the depth of the N type current dispersion layer 3 from the lower surface of the P type base region 4 is changed, and the change in the electric field strength applied to the gate oxide film 8 and the change in the on-state resistance are studied.

Figure 7:
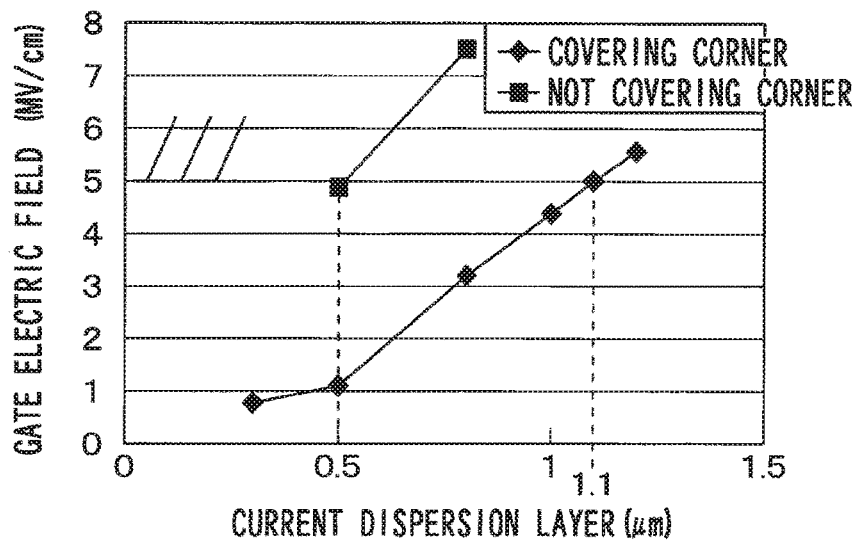
FIG. 7 is a graph showing a relationship between a depth of a N type current dispersion layer and a gate electric field applied to a gate oxide film.

As a result, as shown in FIG. 7, the electric field strength (i.e., a gate electric field) applied to the gate oxide film 8 depends on the depth of the N type current dispersion layer 3. It is confirmed that the electric field strength becomes larger as the depth of the N type current dispersion layer 3 from the lower surface of the P type base region 4 becomes deeper. When comparing cases when the depth of the N type current dispersion layer 3 is 0.5 micrometers, the electric field strength is 5 MV/cm in a case where the P type bottom layer 10 does not cover the corner portion of the bottom of the trench 7, but the electric field strength is 1 MV/cm in a case where the P type bottom layer 10 covers the corner portion of the bottom of the trench 7. Accordingly, when checking the electric field strength applied to the gate oxide film 8, the electric field strength in a case where the P type bottom layer 10 covers the corner portion of the bottom of the trench 7 is reduced to be lower than a case where the P type bottom layer 10 does not cover the corner portion of the bottom of the trench 7.

Further, in view of the insulation breakdown of the gate oxide film 8, a target electric field strength is set to be 5 MV/cm, for example. The depth of the N type current dispersion layer 3 for realizing this feature is 1.1 micrometers in a case where the P type bottom layer 10 covers the corner portion of the bottom of the trench 7, and is 0.5 micrometers in a case where the P type bottom layer 10 does not cover the corner portion of the bottom of the trench 7. Accordingly, in a case where the P type bottom layer 10 covers the corner portion of the bottom of the trench 7, it is possible to restrict the gate oxide film 8 from being damaged even when the N type current dispersion layer 3 is formed to be deeper.

Figure 8:
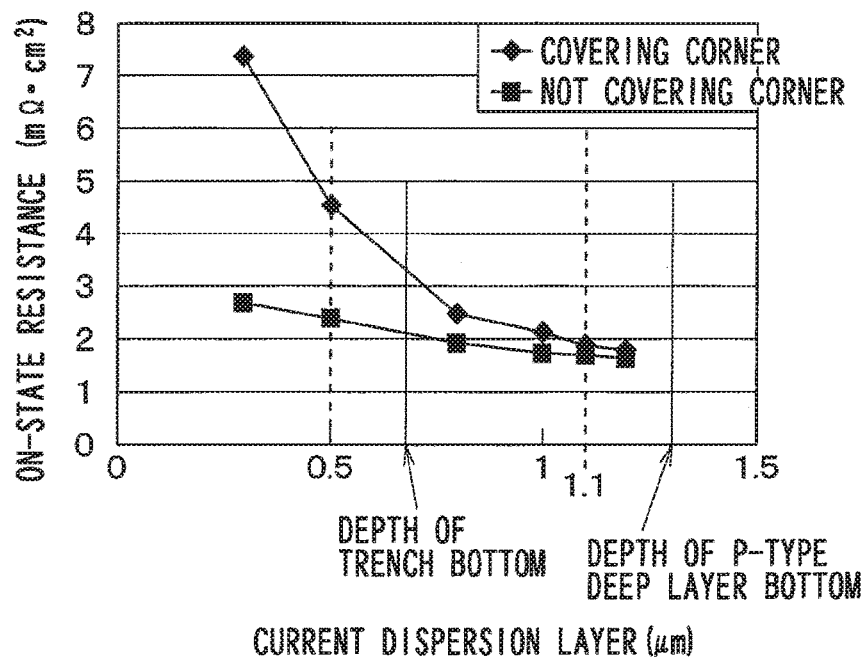
FIG. 8 is a graph showing a relationship between a depth of a N type current dispersion and an on-state resistance.

On the other hand, as shown in FIG. 8, in a case where the P type bottom layer 10 does not cover the corner portion of the bottom of the trench 7, the on-state resistance is 2.4 mΩ·cm² when the depth of the N type current dispersion layer 3 is 0.5 micrometers. On the other hand, in a case where the P type bottom layer 10 covers the corner portion of the bottom of the trench 7, the on-state resistance is 1.8 mΩ·cm² when the depth of the N type current dispersion layer 3 is 1.1 micrometers.

Here, when comparing a case where the P type bottom layer 10 covers the corner portion of the bottom of the trench 7 with a case where the P type bottom layer 10 does not cover the corner portion of the bottom of the trench 7 under a condition that the depth of the N type current dispersion layer 3 is the same, the on-state resistance in a case where the P type bottom layer 10 does not cover the corner portion of the bottom of the trench 7 becomes smaller than a case where the P type bottom layer 10 covers the corner portion of the bottom of the trench 7. However, the depth of the N type current dispersion layer 3 in a case where the P type bottom layer 10 covers the corner portion of the bottom of the trench 7 is capable of deepening more than a case where the P type bottom layer 10 does not cover the corner portion of the bottom of the trench 7. In this case, the on-state resistance in a case where the P type bottom layer 10 covers the corner portion of the bottom of the trench 7 becomes smaller than a case where the P type bottom layer 10 does not cover the corner portion of the bottom of the trench 7.

Thus, when the P type bottom layer 10 covers the corner portion of the bottom of the trench 7, the feature provides large effects on the electric field relaxation in the gate oxide film 8. Thus, it is possible to improve a trade-off relationship between the low on-state resistance and the low gate electric field.

Here, in order to obtain the low on-state resistance and the low gate electric field as above described target properties, it is preferable to deepen the depth of the N type current dispersion layer 3. More specifically, to obtain the properties such that the electric field strength applied to the gate oxide film 8 is equal to or smaller than 5 MV/cm, and the on-state resistance is equal to or smaller than a case where the P type bottom layer 10 does not cover the corner portion of the bottom of the trench 7, it is preferable to deepen the depth of the N type current dispersion layer 3 to be deeper than the bottom of the trench 7. Further, it is necessary to set the depth of the N type current dispersion layer 3 to be equal to or shallower than the P type bottom layer 10.

Second Embodiment

A second embodiment of the present disclosure will be explained. In the present embodiment, the construction of the N type current dispersion layer 3 in the first embodiment is changed. Other features are similar to the first embodiment. Thus, only a different part of the first embodiment will be explained.

Figure 9:
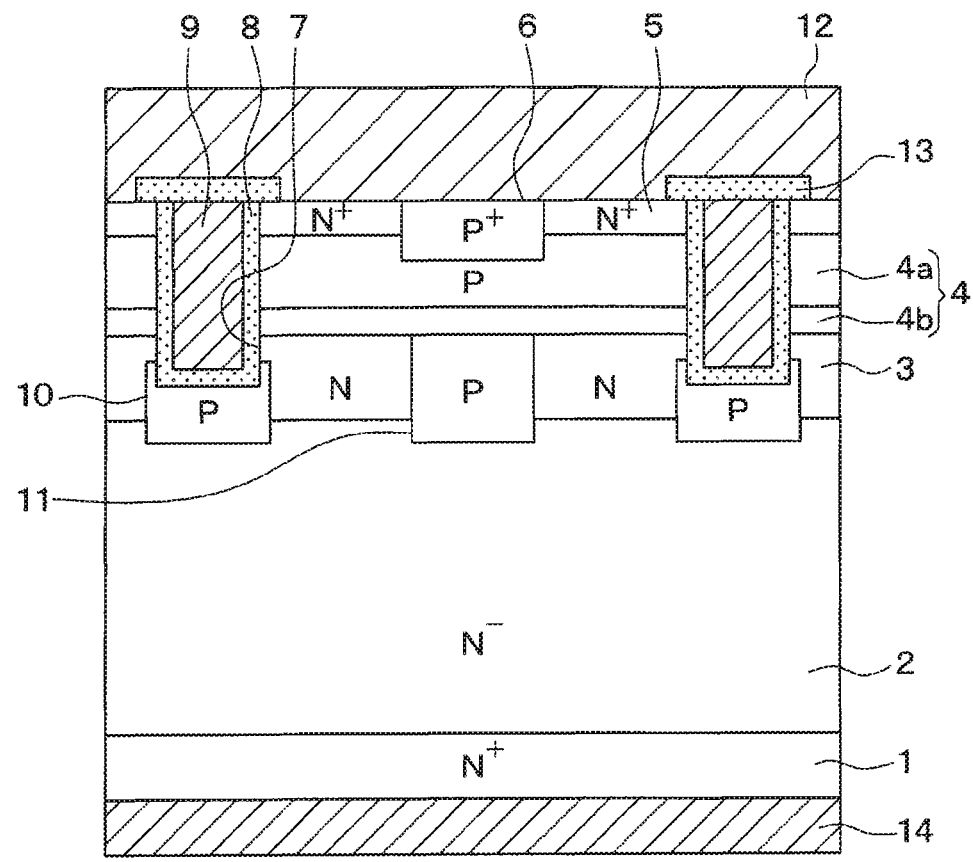
FIG. 9 is a cross sectional diagram showing a MOSFET with a trench gate structure according to a second embodiment of the present disclosure.

As shown in FIG. 9, in the present embodiment, the P type base region 4 arranged over the N type current dispersion layer 3 is configured to include a first layer 4a and a second layer 4b, which have different concentrations, respectively.

The first layer 4a is disposed on a surface side, i.e., in a part of the P type base region 4 on the N+ type source region side and the P+ type contact layer side. The first layer 4a has the P type impurity concentration lower than the second layer 4b. For example, the first layer 4a has a depth of 0.95 micrometers from the surface and the P type impurity concentration of $5.0 \times 10^{16}/cm^3$. The N+ type source region 5 having the depth of 0.5 micrometers from the surface is formed on the first layer 4a. Thus, the thickness of the first layer 4a is about 0.44 micrometers. The second layer 4b is disposed on the N− type drift layer side from the first layer 4a. For example, the thickness of the second layer 4b is 0.05 micrometers, and the P type impurity concentration is $7.0 \times 10^{17}/cm^3$. Other features are similar to the first embodiment. The MOSFET having these features are manufactured by the manufacturing method similar to the first embodiment. Specifically, when the P type base region 4 is formed, the introduction amount of the impurity concentration during the epitaxial growth in a case where the second layer 4b is formed is changed from a case where the first layer 4a is formed. Other steps are similar to the first embodiment.

Then, an operation of the MOSFET according to the present embodiment will be explained as follows.

First, an operation before the gate voltage is applied to the gate electrode 9 is similar to the first embodiment. Next, in case of an off-state (i.e., when the gate voltage is zero volt, the drain voltage is 1200 volts, and the source voltage is zero volt), when a voltage is applied to the drain electrode 14, the depletion layer expands from a boundary between the P type base region 4 and the N type current dispersion layer 3 or the N− type drift layer 2. In this case, since only the concentration of the second layer 4b in the P type base region 4 is increased, the depletion layer is captured in the second layer 4b having the high concentration. Accordingly, even when the thickness of a whole of the P type base region 3 is 0.5 micrometers, the P type base region 3 does not provide a punch through phenomenon, and therefore, no current flows between the source electrode 12 and the drain electrode 14.

Next, in case of the on-state (i.e., when the gate voltage is 20 volts, the rain voltage is 2 volts, and the source voltage is zero volt), the gate voltage of 20 volts is applied to the gate electrode 9. Accordingly, the inversion layer is formed on the surface of the P type base region 4, which contacts the trench 7. Further, the current accumulation layer is formed on the surface of the N type current dispersion layer 3, which contacts the trench 7. Thus, the electron injected from the source electrode 12 passes from the N+ type source region 5 through the inversion layer and the current accumulation layer formed in the P type base region 4, and then, reaches the n type current dispersion layer 3.

Then, the resistance from the N+ type source region 5 to the current accumulation layer is 0.4 Ω·cm² since the thickness of the P type base region 4 is thinner than the first embodiment so that the thickness is changed from 0.7 micrometers to 0.5 micrometers. The resistance of other parts is similar to the first embodiment. Accordingly, in the structure according to the present embodiment, when the gate voltage is 20 volts, and the thickness of the gate oxide film 8 is 75 nanometers, the on-state resistance is 1.85 Ω·cm² (which is equal to a sum of 0.4+0.4+0.8+0.25), and is the low on-state resistance. On the other hand, in the structure shown in FIG. 3, the on-state resistance is 2.45 Ω·cm², and is higher by 0.6 Ω·cm² than the structure according to the present embodiment. Thus, the MOSFET according to the present embodiment realizes the high breakdown voltage and the low on-state resistance.

Other Embodiments

The present disclosure is not limited to the above described embodiments. The present disclosure is changeable.

For example, in the above embodiments, the first conductive type is the N type, and the second conductive type is the P type, and the N channel type MOSFET is explained as an example. Alternatively, the conductive type of each element may be reversed, and the present disclosure may be applied to the P channel type MOSFET. Further, in the above explanation, the trench gate type MOSFET is explained as an example. Alternatively, the present disclosure may be applied to the IGBT having similar trench gate structure. In the IGBT, the conductive type of the substrate 1 in each embodiment is changed from the N type to the P type, and other features and manufacturing steps are similar to each embodiment.

Further, in each embodiment, the gate oxide film 8 formed by the thermal oxidation process is described as a gate insulation film. Alternatively, the gate insulation film may be an oxide film formed by a process other than the thermal oxidation process, or include a nitride film or the like. Further, the forming step of the drain electrode 14 may be performed after the formation step of the source electrode 12.

The invention claimed is:

1. A silicon carbide semiconductor device comprising:
an inversion type MOSFET, wherein:
the MOSFET includes:
  a substrate made of silicon carbide and having a first conductive type or a second conductive type;
  a drift layer made of silicon carbide, arranged on the substrate, and having the first conductive type with an impurity concentration lower than the substrate;
  a current dispersion layer made of silicon carbide, arranged on the drift layer, and having the first conductive type with an impurity concentration higher than the drift layer;
  a base region made of silicon carbide, arranged on the current dispersion layer, and having the second conductive type;
  a source region made of silicon carbide, arranged in an upper portion of the base region, and having the first conductive type with an impurity concentration higher than the drift layer;
  a plurality of trenches arranged from a surface of the source region to a position deeper than the base region, arranged in parallel to each other, and having a stripe shape along one direction as a longitudinal direction;
  a gate insulation film arranged on an inner wall of each trench;
  a gate electrode arranged on the gate insulation film in each trench;
  a source electrode electrically connected to the source region and the base region;
  a drain electrode arranged on a back side of the substrate; and
  a bottom layer arranged under the base region, covering a bottom of each trench including a corner portion of the bottom of the trench, having a depth equal to or deeper than the current dispersion layer, and having the second conductive type;

the MOSFET provides an inversion type channel region in a surface portion of the base region, which is disposed on a sidewall of the trench, by controlling an application voltage to the gate electrode; and
the MOSFET flows current between the source electrode and the drain electrode through the source region, the current dispersion layer and the drift layer; and
the bottom layer is spaced apart from the base region.

2. The silicon carbide semiconductor device according to claim 1, wherein:
the current dispersion layer is arranged at a position deeper than the bottom of each trench.

3. The silicon carbide semiconductor device according to claim 1, further comprising:
a deep layer having the second conductive type, arranged between adjacent two trenches among the plurality of trenches arranged in parallel to each other, contacting the base region, and reaching the drift layer.

4. The silicon carbide semiconductor device according to claim 3, wherein:
the bottom layer and the deep layer each have an impurity concentration sufficient to prevent a depletion layer from fully depleting, where the depletion expands from a boundary of the current dispersion layer and where a voltage is applied to the drain electrode in an inversion bias manner.

5. The silicon carbide semiconductor device according to claim 4, wherein:
the impurity concentration of the bottom layer and the impurity concentration of the deep layer are higher than twice an impurity concentration of the current dispersion layer.

6. The silicon carbide semiconductor device according to claim 1, wherein:
the base region includes a first layer disposed on a source region side and a second layer disposed on a current dispersion layer side; and
the second layer has an impurity concentration higher than the first layer.

7. The silicon carbide semiconductor device according to claim 1, wherein:
the current dispersion layer has an impurity concentration sufficient to establish a distance between the base region and the bottom layer larger than twice a distance of a depletion layer expanding in the current dispersion layer by an inner electric potential of silicon carbide, and
the distance (L) of the depletion layer expanding in the current dispersion layer by the inner electric potential of silicon carbide is calculated by an equation as follows:

$$L = \sqrt{\frac{2Ks\varepsilon_0 \psi d}{qNd}}$$

where:
Nd is an impurity concentration of the current dispersion layer,
$\varepsilon_0$ is a dielectric constant of vacuum,
q is an elementary charge,
Ks is a relative dielectric constant of silicon carbide, and
$\psi d$ is an inner electric potential of silicon carbide.

8. The silicon carbide semiconductor device according to claim 1, further comprising:
   a contact layer made of silicon carbide, arranged in another upper portion of the base region, and having the second conductive type with an impurity concentration higher than the base region, wherein:
   the contact layer has a thickness larger than the source region.

* * * * *